(12) United States Patent
Topaloglu

(10) Patent No.: US 7,990,676 B2
(45) Date of Patent: Aug. 2, 2011

(54) DENSITY-CONFORMING VERTICAL PLATE CAPACITORS EXHIBITING ENHANCED CAPACITANCE AND METHODS OF FABRICATING THE SAME

(75) Inventor: Rasit Topaloglu, Santa Clara, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 471 days.

(21) Appl. No.: 11/869,790

(22) Filed: Oct. 10, 2007

(65) Prior Publication Data

US 2009/0097186 A1    Apr. 16, 2009

(51) Int. Cl.
*H01G 4/005* (2006.01)
(52) U.S. Cl. ........ 361/303; 361/302; 361/305; 361/311; 361/313; 361/306.1
(58) Field of Classification Search ............... 361/306.1, 361/306.3, 301.4, 311–313, 321.2, 303, 305, 361/307, 309, 321.1, 321.4
See application file for complete search history.

(56) References Cited

U.S. PATENT DOCUMENTS

| | | | |
|---|---|---|---|
| 5,208,725 A | 5/1993 | Akcasu | |
| 5,583,359 A * | 12/1996 | Ng et al. | 257/306 |
| 6,266,226 B1 | 7/2001 | Hayashi | |
| 6,417,535 B1 | 7/2002 | Johnson et al. | |
| 6,649,852 B2 | 11/2003 | Chason et al. | |
| 6,653,681 B2 * | 11/2003 | Appel | 257/307 |
| 6,819,542 B2 * | 11/2004 | Tsai et al. | 361/304 |
| 6,906,905 B1 * | 6/2005 | Chinthakindi | 361/277 |
| 7,061,746 B2 * | 6/2006 | Abdallah et al. | 361/301.4 |
| 7,154,734 B2 | 12/2006 | Schultz et al. | |
| 7,202,548 B2 | 4/2007 | Lee | |
| 7,564,675 B2 * | 7/2009 | Chen et al. | 361/303 |
| 7,602,599 B1 * | 10/2009 | Hsu | 361/303 |
| 7,646,583 B2 * | 1/2010 | Hsien et al. | 361/303 |
| 7,738,237 B2 | 6/2010 | Lee | |
| 2005/0013087 A1 | 1/2005 | Wu et al. | |
| 2009/0133252 A1 | 5/2009 | Drapkin et al. | |

OTHER PUBLICATIONS

Daeik Kim et al., "Symmetric Vertical Parallel Plate Capacitors for On-Chip RF Circuits in 65-nm SOI Technology," IEEE Electron Device Letters, vol. 28, No. 7, Jul. 2007, pp. 616-618.
PCT International Search Report for PCT Application No. PCT/IB2008/003002 mailed Mar. 31, 2009.
PCT Written Opinion for PCT Application No. PCT/IB2008/003002 mailed Mar. 31, 2009.
U.S. Office Action for U.S. Appl. No. 11/945,089 mailed Aug. 18, 2010.
Response to Aug. 18, 2010 Office Action for U.S. Appl. No. 11/945,089, filed Feb. 18, 2011.

* cited by examiner

*Primary Examiner* — Nguyen T Ha
(74) *Attorney, Agent, or Firm* — Ingrassia Fisher & Lorenz, P.C.

(57) ABSTRACT

Density-conforming vertical plate capacitors exhibiting enhanced capacitance and methods for fabricating density-conforming vertical plate capacitors exhibiting enhanced capacitance are provided. An embodiment of the density-conforming vertical plate capacitor comprises a first conductive interconnect and a second conductive interconnect. The second conductive interconnect overlies the first conductive interconnect and is substantially aligned with the first conductive interconnect. A via bar electrically couples the first conductive interconnect and the second conductive interconnect. The via bar has a width and a length that is larger than the width and contributes to the capacitance of the vertical plate capacitor.

10 Claims, 5 Drawing Sheets

DENSITY-CONFORMING VERTICAL PLATE CAPACITORS EXHIBITING ENHANCED CAPACITANCE AND METHODS OF FABRICATING THE SAME

FIELD OF THE INVENTION

The present invention generally relates to semiconductor devices and methods for fabricating semiconductor devices, and more particularly relates to density-conforming vertical plate capacitors exhibiting enhanced capacitance and methods for fabricating density-conforming vertical plate capacitors exhibiting enhanced capacitance.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration has led to a continued shrinking of circuit dimensions and device features. However, as device features become smaller, required device performance and functionality have increased. For example, capacitors, which are typical devices integrated into integrated circuits, are becoming smaller and smaller. Nevertheless, IC design still requires large charge storage from the capacitors.

Vertical plate capacitors are one type of capacitor used in IC design. The design and fabrication of present-day vertical plate capacitors suffer from several challenges. In some cases, such as when the density of neighboring circuitry is relatively low, the dimensions of a vertical plate capacitor can be increased to increase charge storage of the capacitor. However, in other cases, such as when the density of neighboring circuitry is high, the dimensions of the capacitor may be restricted, thus resulting in a vertical plate capacitor with less than desired capacitance. For example, one typical type of vertical plate capacitor has sets of two electrodes, each electrode having multiple fingers or interconnects coupled to a stub, with the interconnects of each electrode interdigitated with the interconnects of the other. Each set of electrodes is formed in a dielectric material layer with multiple sets of electrodes overlying each other in a stacked formation. Vias are formed in dielectric layers interposed between the sets of electrodes to couple adjacent, stacked electrode sets. Typical vertical plate capacitors may have five to eight layers of electrode sets and hundreds of vias coupling stacked electrode sets. To achieve high capacitance, the interconnects of each electrode are relatively long so that there is large area of overlap between the interconnects of the same dielectric layer. However, because the electrodes typically are formed in a dielectric layer using a damascene process, the interconnects are only as thick as the dielectric layer in which the electrodes are formed. The capacitance generated between overlying electrodes and that generated between vias within the same dielectric layer do not contribute substantially to the overall capacitance of the device. Thus, the overall capacitance of the vertical plate capacitor is limited by the interconnects' thicknesses or heights.

Further, while the average thicknesses of the interconnects limit the overall capacitance of the vertical plate capacitor, variations within the metal density of the interconnects and other metals structures within the same dielectric layer may pose problems in the operation of the capacitor-containing device and, hence, decrease device yield. The longer the interconnects are, the more likely there are to be substantial metal density variations in the layer. Although the overall metal density of the interconnects and other metal features in a dielectric layer of the device is determined by fabrication standards, variations in the metal density of the interconnects and the other metal features may result from the routing design of the various circuits. This mismatch in the metal densities of the capacitance regions and the circuit regions may, in turn, result in metal height variations after chemical mechanical planarization (CMP) is performed. Such metal height variations increase the difficulty of CMP optimization and may result in inferior CMP planarization effects, such as underpolishing, otherwise known as metal puddling, that causes electrical shorting, or overpolishing that causes electrical open circuits. In addition, such inferior CMP planarization may result in on-chip resistance and capacitance variations.

Accordingly, it is desirable to provide a density-conforming vertical plate capacitor that can provide larger capacitance than prior art capacitors without an increase in interconnect length or height. In addition, it is desirable to provide a density-conforming vertical plate capacitor with via bars that contribute substantially to the overall capacitance of a device. It also is desirable to provide a method for fabricating a density-conforming vertical plate capacitor that results in improved metal height uniformity. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A density-conforming vertical plate capacitor in accordance with an exemplary embodiment of the present invention comprises a first conductive interconnect and a second conductive interconnect. The second conductive interconnect overlies the first conductive interconnect and is substantially aligned with the first conductive interconnect. A via bar electrically couples the first conductive interconnect and the second conductive interconnect. The via bar has a width and a length that is larger than the width and contributes to the capacitance of the vertical plate capacitor A density-conforming vertical plate capacitor in accordance with another exemplary embodiment is provided. The vertical plate capacitor comprises a plurality of first metal interconnects, a plurality of second metal interconnects, and a plurality of via bars. Each of the plurality of via bars has a width and a length that is greater than the width. At least one of the plurality of via bars electrically couples one first metal interconnect of the plurality of first metal interconnects and one second metal interconnect of the plurality of second metal interconnects. The plurality of via bars is responsible for at least about 5% of the capacitance of the vertical plate capacitor.

A method of fabricating a density-conforming vertical plate capacitor in accordance with an exemplary embodiment of the present invention is provided. The method comprises depositing a first dielectric layer overlying a second dielectric layer. A first conductive interconnect is disposed within the second dielectric layer. A via bar opening is etched into the first dielectric layer to expose the first conductive interconnect and a first conductive material is deposited in the via bar opening to form a via bar. The via bar has a width and a length that is at least about twice the width. A second conductive interconnect is formed so that it is electrically and physically coupled to the via bar.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
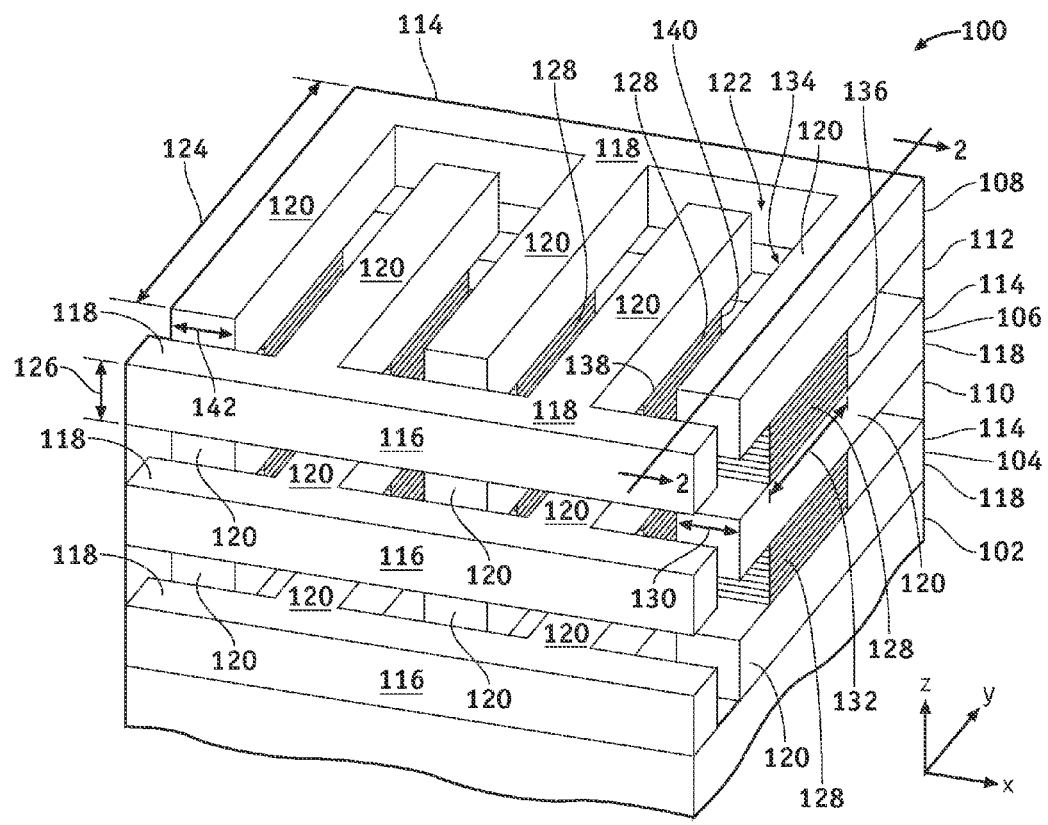
FIG. 1 is an isometric view of a vertical plate capacitor in accordance with an exemplary embodiment of the present invention.
Figure 2:
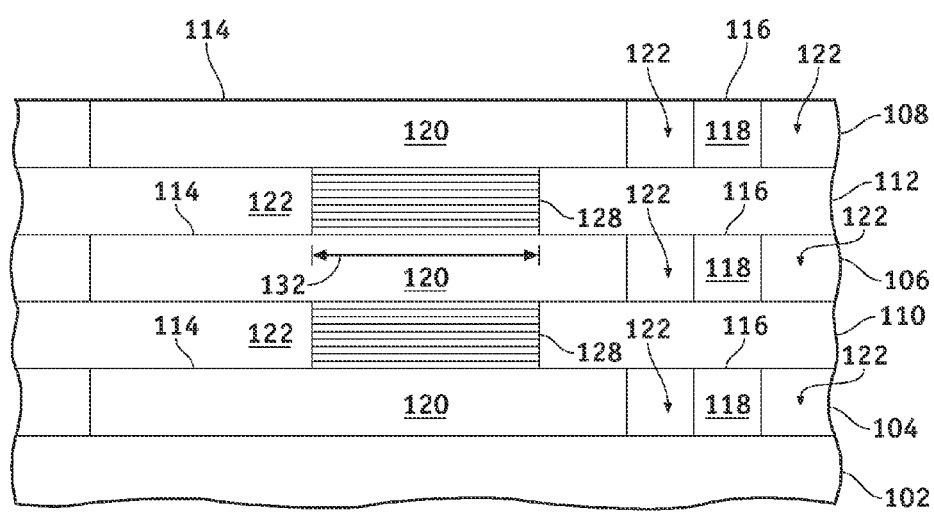
FIG. 2 is a cross-sectional view of the vertical plate capacitor of FIG. 1, taken along the 2-2 axis.

FIG. 1 is an isometric view a density-conforming vertical plate capacitor 100 in accordance with an exemplary embodiment of the present invention. FIG. 2 is a cross-sectional view of vertical plate capacitor 100 of FIG. 1 taken along the 2-2 axis. The capacitor 100 is formed overlying a substrate 102. The substrate 102 may comprise a semiconductor material, such as a silicon substrate, a dielectric material layer, such as a silicon dioxide layer, a dielectric material layer having metal lines, interconnects or electronic devices formed therein, or the like. Capacitor 100 comprises a first interconnect layer 104, a second interconnect layer 106, and a third interconnect layer 108 fabricated in a stacked formation. While three interconnect layers 104, 106, and 108 are illustrated in FIGS. 1 and 2, it will be appreciated that capacitor 100 may comprise two interconnect layers or more than three interconnect layers depending on the desired performance and functionality of capacitor 100. First interconnect layer 104 is electrically and physically isolated from second interconnect layer 106 by a first dielectric layer 110. Similarly, second interconnect layer 106 is electrically and physically isolated from third interconnect layer 108 by a second dielectric layer 112.

Each interconnect layer 104, 106, and 108 comprises a first electrode 114 and a second electrode 116 disposed within dielectric material 122. In turn, each electrode 114 and 116 includes a stub 118 and a plurality of conductive interconnects 120 that extend perpendicularly from the stub. The conductive interconnects of first electrode 114 form an interdigitated pattern with the conductive interconnects of second electrode 116. Dielectric material 122 within each of the interconnect layers electrically isolates the conductive interconnects 120 of the first electrode 114 from the conductive interconnects 120 of the second electrode. The overlap of the surface area of the interconnects 120 of electrode 114 and of electrode 116 within the same interconnect layer increases as the length of the interconnects increases. It will be appreciated that vertical plate capacitor 100 may have any other suitable form or configuration of electrodes, stubs, interconnect projections, and/or interconnects that utilize the principles of vertical plate capacitance. Further, the interconnects may have varying lengths, widths, and heights.

Figure 3:
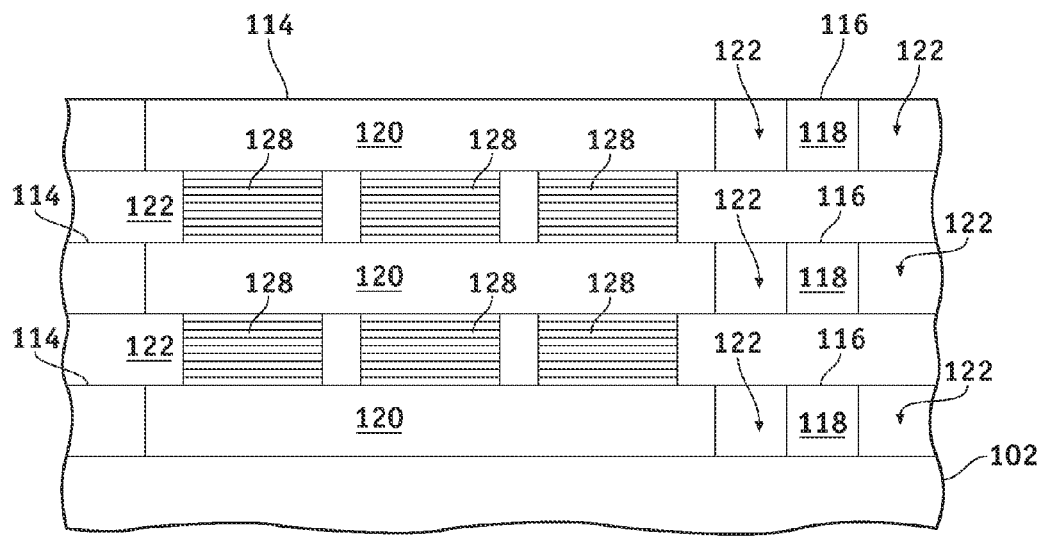
FIG. 3 is a cross-sectional view of the vertical plate capacitor of FIG. 1, taken along the 2-2 axis, in accordance with another exemplary embodiment of the present invention.

An increase in the lengths, indicated by double-headed arrows 124, and an increase in the heights, indicated by double-headed arrows 126, of one or more of the interconnects 120 may increase the capacitance of vertical plate capacitor 100, although an increase in the widths, indicated by double-headed arrow 142, of one or more of the interconnects 120 may have negligible affect on the capacitance. The lengths 124 and the widths 142 of the interconnects 120 define the capacitor metal density. While it may not be possible to increase the length and/or the height of the interconnects because of limited area or a fixed process, respectively, an increase in the widths 142 can increase the metal density of the capacitor so that it conforms to the neighboring metal density, although such an increase in the widths 142 will have negligible affect on capacitance. However, an increase in capacitance of vertical plate capacitor 100 can be achieved by use of via bars 128. Via bars 128 are disposed within the first dielectric layer 110 and the second dielectric layer 112 and electrically couple the conductive interconnects 120 in adjacent interconnect layers. Unlike a conventional via, which typically has a length that is equal to its width, in accordance with an exemplary embodiment of the present invention, via bars 128 have a length, indicated by double-headed arrow 132, that is greater than a width, indicated by double-headed arrow 130, of the via bar. In one exemplary embodiment of the present invention, the length 132 is at least about twice the width 130. In another exemplary embodiment, the length 132 is at least about three times the width 130. In yet another exemplary embodiment, the length 132 is at least about five times the width 130. In a preferred exemplary embodiment, the length 132 is approximately equal to the length 124 of interconnects 120. The greater the length 132 of the via bar, the more closely vertical plate capacitor 100 resembles a capacitor with optimal vertical plates that result in maximum capacitance. In an exemplary embodiment of the invention, the via bars increase the capacitance of vertical plate capacitor 100 by at least about five percent (5%) compared to vertical plate capacitors with conventional vias. Alternatively, rather than one long via bar connecting two parallel, adjacent interconnects 120, multiple via bars 128 of the same or varying length can be used to electrically couple the interconnects, as illustrated in FIG. 3.

Figure 4:
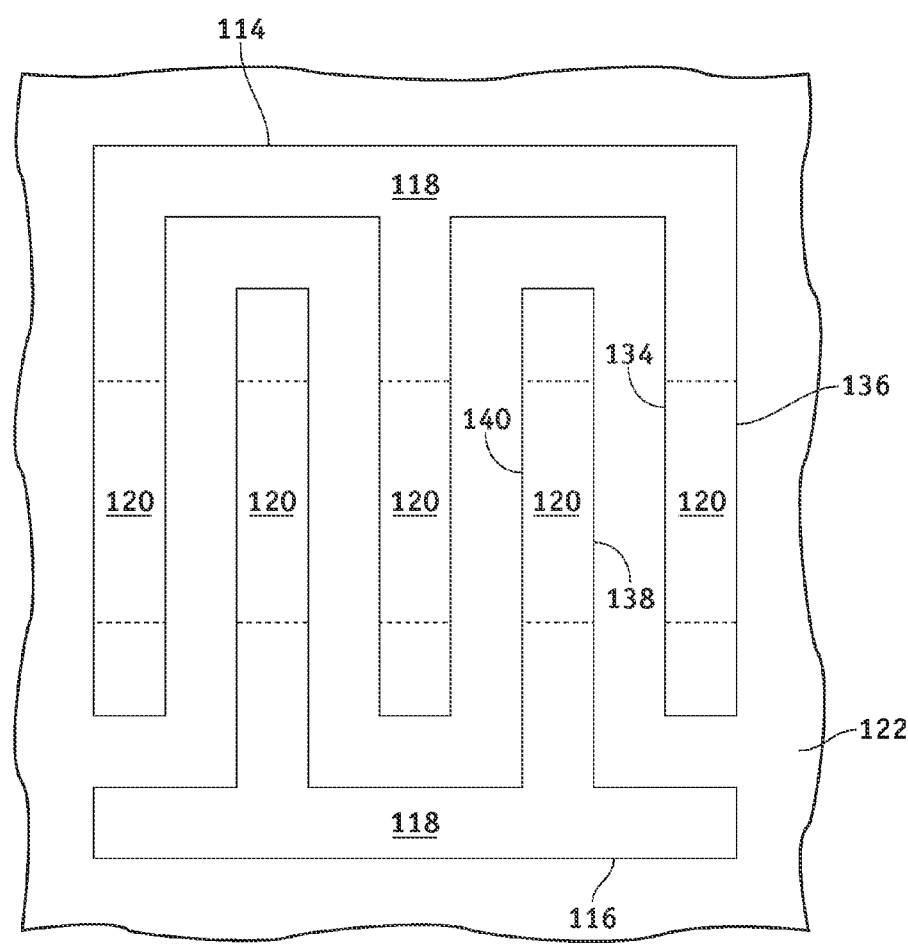
FIG. 4 is a top view of the vertical plate capacitor of FIG. 1.

In another exemplary embodiment of the present invention, as illustrated in FIG. 1, the via bars disposed within the same dielectric layer are at least partially aligned in parallel manner. In other words, at least a portion of a side surface of a via bar directly faces at least a portion of a side surface of a parallel, adjacent via bar. For example, as illustrated in FIG. 4, which is a top view of vertical plate capacitor 100 with the via bars illustrated in dashed lines, a side surface 134 of a first via bar 136 directly faces a side surface 138 of a second, adjacent via bar 140. In a preferred embodiment, a substantial portion of the side surfaces directly face each other, as the greater the portion of the side surfaces that face each other, the greater capacitance between the via bars 136 and 140.

The use of via bars permits a vertical plate capacitor to be designed in accordance with the neighboring device or circuit density, that is, it can be designed to be "density aware" or "density conforming". For example, during chip design, if the device or circuit density neighboring the vertical plate capacitor will be low, the capacitor can be designed with dimensions that take advantage of the available real estate; alternatively, if the device or circuit density neighboring the vertical plate capacitor will be high, the capacitor can be designed with smaller dimensions that take into account the lack of available real estate. In either case, via bars can be utilized to enhance capacitance of the vertical plate capacitor. A density-conforming or density-aware vertical plate capacitor (hereinafter, "density-conforming vertical plate capacitor) also minimizes overall density variation, which results in improved CMP processing and, thus, improved chip performance.

Figure 5:
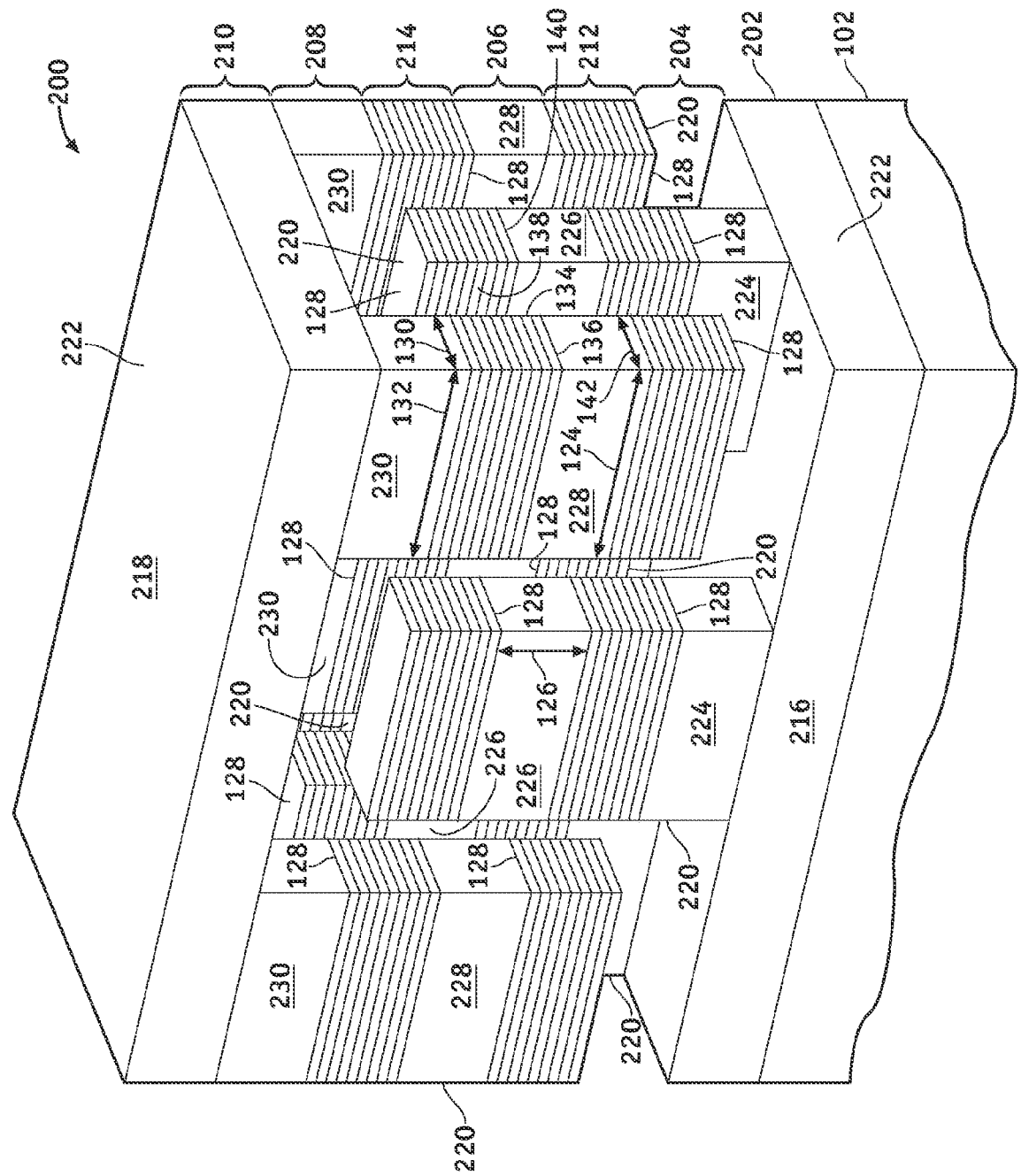
FIG. 5 is an isometric view of a vertical plate capacitor in accordance with another exemplary embodiment of the present invention.

FIG. 5 is an isometric view of a density-conforming vertical plate capacitor 200 in accordance with another exemplary embodiment of the invention. Vertical plate capacitor 200 is formed with five interconnect layers, that is, a first interconnect layer 202, a second interconnect layer 204, a third interconnect layer 206, a fourth interconnect layer 208, and a fifth interconnect layer 210. A first dielectric layer 212 physically and electrically isolates the second interconnect layer 204 from the third interconnect layer 206 and a second dielectric layer 214 physically and electrically isolates the third interconnect layer 206 from the fourth interconnect layer 208. Although five interconnect layers and two dielectric layers are used to form vertical plate capacitor 200, it will be understood that the invention is not so limited and any suitable number of interconnect layers and dielectric layers may be used depending on the design criteria and functionality of vertical plate capacitor 200.

Vertical plate capacitor 200 comprises a first electrode 216 and a second electrode 218. Each electrode in turn comprises a stub or connecting route 222 and a plurality of interconnect projections 220 extending vertically therefrom. While the vertical plate capacitor 200 of FIG. 5 is illustrated with three rows and three columns of interconnect projections in an interdigitated pattern, it will be appreciated that the capacitor may have any suitable number of rows and columns of interconnect projections. For example, capacitor 200 may have only one row having multiple columns of interdigitated interconnect projections. In another exemplary embodiment, the interconnect projections of the two electrodes are not interdigitated, such as when each electrode has a comb-like pattern. The stub 222 of first electrode 216 is disposed on substrate 102 within first interconnect layer 202. Each of the interconnect projections 220 of first electrode 216 comprises a first conductive interconnect 224 that is disposed within second interconnect layer 204 and a second conductive interconnect 226 that is disposed within third interconnect layer 206. Each of the interconnect projections 220 of second electrode 218 comprises a first conductive interconnect 228 that is disposed within third interconnect layer 206 and a second conductive interconnect 230 that is disposed within fourth interconnect layer 208. The stub 222 of the second electrode is disposed within fifth interconnect layer 210. In yet another exemplary embodiment, the stubs 222 of the first electrode and/or the second electrode are disposed in layers other than the first and the fifth interconnect layers, such as the second, third, and/or fourth interconnect layers. It will be appreciated that vertical plate capacitor 200 may have any other suitable form or configuration of electrodes, stubs, interconnect projections, and/or interconnects that utilize the principles of vertical plate capacitance. For example, the stubs can have a comb-shape. Further, the interconnects may have varying lengths, heights, and widths.

An increase in the lengths 124 and the heights 126 of interconnects 224, 226, 228, and 230 may increase the capacitance of vertical plate capacitor 100, although an increase in the widths 142 of the interconnects 120 may have negligible affect on the capacitance. However, the lengths 124 and the widths 142 of the interconnects define the capacitor metal density. While it may not be possible to increase the width of the interconnects so that the metal density of the capacitor conforms to the neighboring metal density, the spacing between the interconnect projections can be decreased, although this may have little effect on the capacitance. Furthermore, the capacitance structure 200 provide a means to more efficiently adjust the metal density to conform to neighboring metal densities. Different metal densities for different layers can be obtained by adjusting stub shapes, stub layers and projection layout configurations. An increase in capacitance of vertical plate capacitor 200 can be achieved by use of via bars 128. Each parallel conductive interconnect of each interconnect projection 220 is electrically and physically coupled to any overlying conductive interconnect by a via bar 128. As described above, in one exemplary embodiment of the invention, each via bar 128 has a length 132 that is greater than its width 130. In another exemplary embodiment of the present invention, the length 132 is at least about twice the width 130. In yet another exemplary embodiment, the length 132 of each via bar 128 is at least about three times its width 130. In a further exemplary embodiment, the length 132 of each via bar 128 is at least about five times its width 130. While the length 132 of each via bar 128 can be less than the length 124 of the conductive interconnects against which the via bar is disposed, in a preferred embodiment, the length 132 of each via bar 128 is substantially equal to the length 124 of at least one of the conductive interconnects against which the via bar is disposed. The greater the length 132 of the via bar, the more closely each of the interconnect projections 220 resembles a vertical plate and the more vertical plate capacitor 200 resembles a capacitor with optimal vertical plates that result in maximum capacitance. In an exemplary embodiment, the via bars increase the capacitance of vertical plate capacitor 200 by at least about 5% compared to similar vertical plate capacitors with conventional vias. Alternatively, rather than one long via bar connecting two parallel interconnects, multiple via bars 128 of the same or varying length can be used to electrically couple the interconnects. In another exemplary embodiment of the present invention, as illustrated in FIG. 5, the via bars 128 disposed within the same dielectric layer are at least partially aligned in parallel manner, thus further increasing the capacitance of the vertical plate capacitor 200. In other words, at least a portion of a side surface of a via bar directly faces at least a portion of a side surface of a parallel via bar within the same dielectric layer. For example, as illustrated in FIG. 5, side surface 134 of first via bar 136 directly faces side surface 138 of second via bar 140. In a preferred embodiment, a substantial portion of the side surfaces directly face each other, as the greater the portion of the side surfaces that face each other, the greater the capacitance between the via bars 136 and 140.

Figure 6:
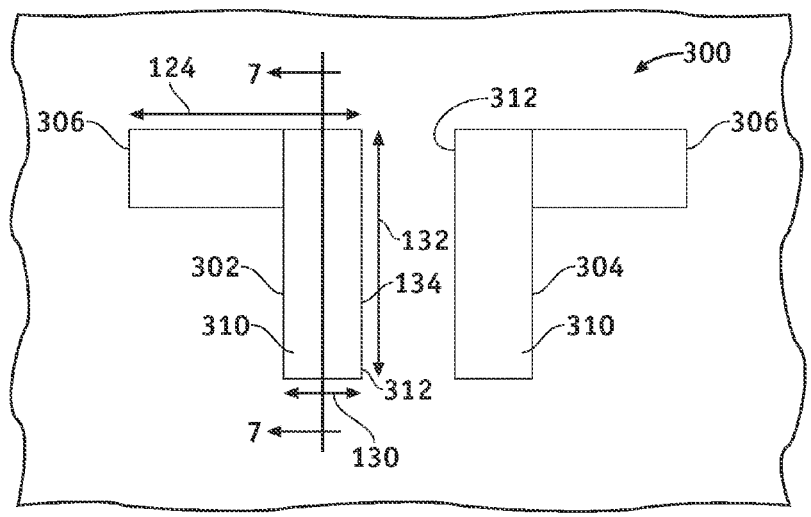
FIG. 6 is a top view of a vertical plate capacitor in accordance with a further exemplary embodiment of the present invention.
Figure 7:
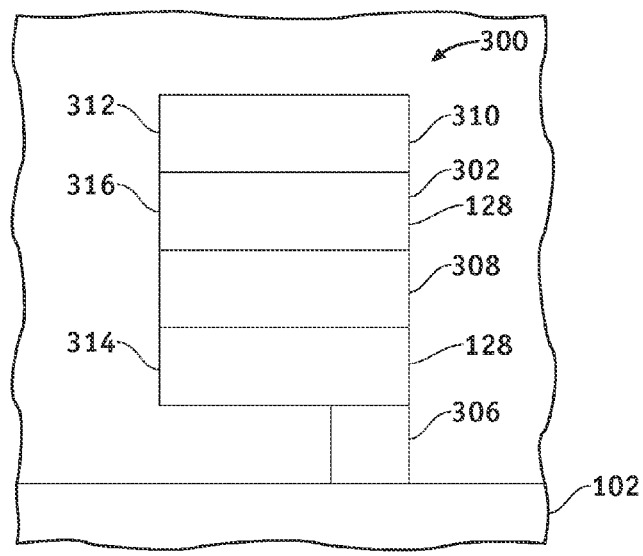
FIG. 7 is a cross-sectional view of the vertical plate capacitor of FIG. 6 taken along the 7-7 axis.
Figure 8:
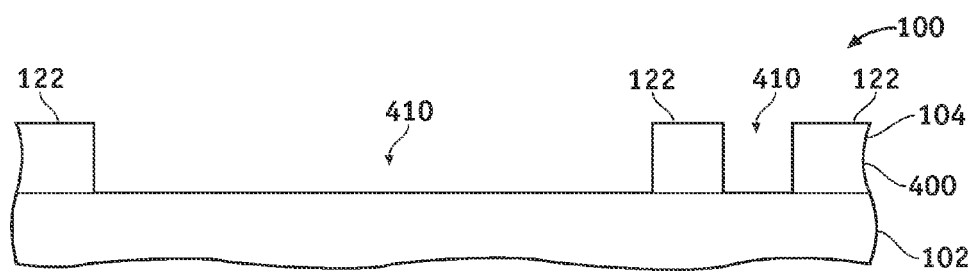
FIGS. 8-11 illustrate, in cross-section, a method for fabricating a vertical plate capacitor in accordance with an exemplary embodiment of the present invention.

It will be appreciated that smaller density-conforming vertical capacitance structures can also be fabricated using via bars to maximize capacitance. For example, FIGS. 6 and 7 illustrate a density-conforming vertical plate capacitor 300 comprising two capacitor plates 302 and 304. Each capacitor plate comprises a first conductive interconnect 306, which is disposed on a substrate 102, a second conductive interconnect 308, and a third conductive interconnect 3 10. The first conductive interconnect 306 is used to route capacitor 300 to other circuits or networks and has a length 124 that may or may not be equal to the lengths 124 of the second and third conductive interconnects 308 and 310. The first conductive interconnects 306 of plates 302 and 304 lie in substantially the same plane and the second and third conductive interconnects of each plate are perpendicular to the first conductive interconnect 306 of the respective plate. The first conductive interconnects 306 may be disposed underlying either end of the respective plates 302 and 304 or may be disposed between the ends of the respective plates; similarly, the plates 302 and 304 may be disposed overlying an end of each respective first conductive interconnect 306 or may be disposed between the ends of each respective first conductive interconnect 306. While vertical plate capacitor 300 is illustrated with plates having three conductive interconnects, it will be understood that the plates of vertical plate capacitor 300 may have two or more than three conductive interconnects depending on the desired performance and functionality of capacitor 300.

A first via bar 314 is interposed between and electrically couples the first conductive interconnect 306 and the second conductive interconnect 308 of each structure. The length 132 of first via bar 314 is perpendicular to the length 124 of first conductive interconnect 306 and is parallel to the lengths 124 of second and third conductive interconnects 308 and 310. A second via bar 316 is interposed between and electrically couples second conductive interconnect 308 and third conductive interconnect 310. As described above, in one exemplary embodiment of the invention, each via bar has a length 132 that is greater than its width 130. In another exemplary embodiment, the length 132 of each via bar is at least about twice its width 130. In yet another exemplary embodiment, the length 132 of each via bar is at least about three times its width 130. In a further exemplary embodiment, the length 132 of each via bar 128 is at least about five times its width 130. In a preferred embodiment, the length 132 of each via bar is substantially equal to the length 124 of at least one of the conductive interconnects against which the via bar is disposed. The greater the length 132 of the via bar, the more closely a surface 312 of each of the structures 302 and 304 resembles a vertical plate and the more vertical plate capacitor 300 resembles a capacitor with optimal vertical plates that result in maximum capacitance. In an exemplary embodiment, the via bars increase the capacitance of vertical plate capacitor 300 by at least about 5% compared to similar vertical plate capacitors with conventional vias. Alternatively, rather than one long via bar connecting two parallel interconnects, multiple via bars of the same or varying length can be used to electrically couple the interconnects.

In another exemplary embodiment of the present invention, as illustrated, the via bars 314 and 316 of each capacitor structure 302 and 304 that are disposed within the same dielectric layer are at least partially aligned in parallel manner. In a preferred embodiment, the via bars of the same dielectric layers substantially overlap, thus further increasing the capacitance of the vertical plate capacitor 300. In other words, at least a portion of a side surface of a via bar 128 of capacitor structure 302 directly faces at least a portion of a side surface of a parallel via bar 128 of capacitor structure 304. For example, as illustrated in FIGS. 6 and 7, a side surface 312 of first via bar 314 of capacitor structure 302 directly faces a side surface 312 of first via bar 314 of capacitor structure 304. In a preferred embodiment, a substantial portion of the side surfaces directly face each other, as the greater the portion of the side surfaces that face each other, the greater capacitance between the via bars. While FIGS. 1-7 illustrate three exemplary configurations of density-conforming vertical plate capacitors having via bars that contribute to the capacitance of the capacitor, it will be appreciated that via bars may be used in any number of other configurations of vertical plate capacitors to enhance and/or maximize the capacitance of the vertical plate capacitor.

A method for fabricating a density-conforming vertical plate capacitor, such as vertical plate capacitor 100 of FIGS. 1 and 2, in accordance with an exemplary embodiment of the present invention is illustrated in FIGS. 8-11. FIGS. 8-11 are cross-sectional views taken along axis 2-2 of FIG. 1. The method begins by forming a first interconnect layer 104. First interconnect layer 104 is formed by depositing a first layer 400 of dielectric material 122 on substrate 102. In one exemplary embodiment, substrate 102 can be a silicon substrate wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. The substrate may be a bulk silicon wafer, or may be a thin layer of silicon on an insulating layer (commonly know as silicon-on-insulator or SOI) that, in turn, is supported by a carrier wafer. In another exemplary embodiment, substrate 102 can be one or more dielectric material layers or one or more dielectric material layers within which have been formed various conductive interconnects, circuits, and/or devices. The dielectric material 122 may comprise any suitable insulator such as a silicon oxide, a silicon nitride, or the like. Dielectric material can be deposited, for example, by chemical vapor deposition (CVD), low pressure chemical vapor deposition (LPCVD), or plasma enhanced chemical vapor deposition (PECVD). Once deposited, a patterned photoresist (not shown) is formed on the dielectric material 122 and is used as an etch mask during etching of dielectric material 122. Dielectric material 122 is etched to form interconnect openings 410 within which one or more first interconnects, such as interconnects 120 of a first electrode 114 and a second electrode 116 of FIG. 1, will be disposed. The patterned photoresist then is removed.

Figure 9:
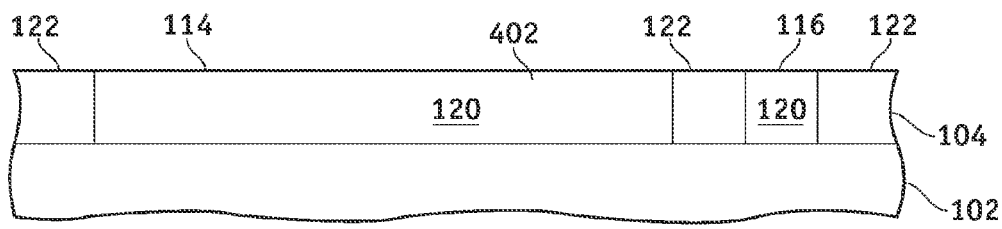

Referring to FIG. 9, a conductive material layer 402 is deposited overlying the substrate 102 and the first layer 400 of dielectric material 122 and within interconnect openings 410. The conductive material layer 402 may comprise any suitable conductive material such as, for example, a metal, a metal alloy, or a conductive polymer. Preferably, the conductive material layer 402 comprises copper or aluminum. One or more barrier or seed layers comprising, for example, tantalum nitride or titanium nitride, may be deposited before deposition of conductive material layer 402. Any excess conductive material overlying dielectric material layer 400 may be removed, such as by chemical mechanical planarization (CMP), to form first interconnects, such as interconnects 120 of first electrode 114 and second electrode 116 of first interconnect layer 104, shown in FIG. 1.

Figure 10:
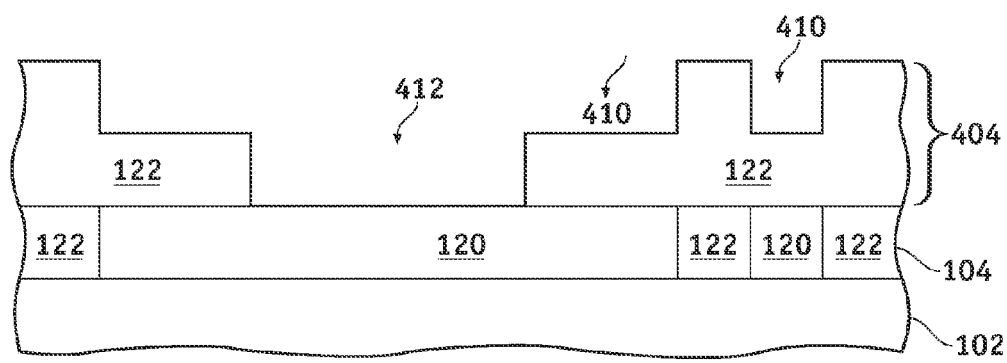

The method continues in accordance with an exemplary embodiment of the present invention with the deposition of a second layer 404 of dielectric material 122, as illustrated in FIG. 10. Once deposited, a first patterned photoresist (not shown) is formed on the dielectric material 122 and is used as an etch mask during etching of dielectric material 122. Dielectric material 122 is etched to expose first interconnects 120 and form openings 412 within which one or more via bars can be formed. The dielectric material 122 is etched so that the via bar openings 412 have a length that is greater than their widths. The first patterned photoresist is removed and a second patterned photoresist (not shown) is formed on the dielectric material 122. The second patterned photoresist is used as an etch mask to form shallower openings 410 within which second conductive interconnects, such as conductive interconnects 120 of an electrode 114 and an electrode 116, can be formed.

Figure 11:
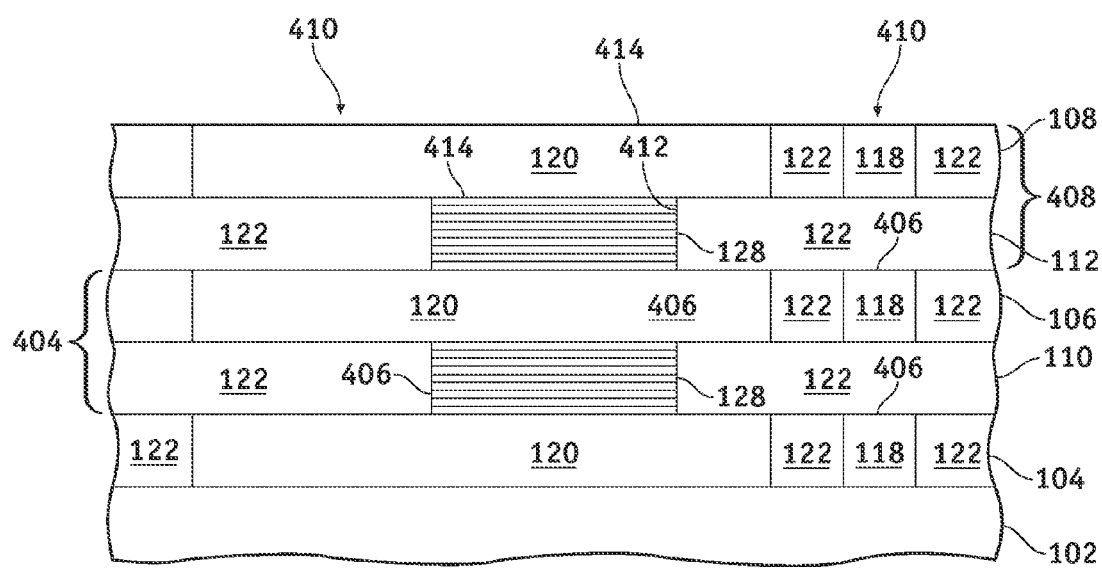

Referring to FIG. 11, a conductive material layer 406 is deposited overlying the first interconnect layer 104 and within opening 410 and 412. The conductive material layer 402 may comprise any suitable conductive material such as those used for conductive material layer 402. Preferably, the conductive material layer 406 comprises copper or aluminum. One or more barrier or seed layers comprising, for example, tantalum nitride or titanium nitride may be deposited before deposition of conductive material layer 406. Any excess conductive material overlying second layer 404 of dielectric material 122 may be removed, such as by CMP, to form a via bar 128 within a first portion of second layer 404, shown in FIG. 1 as first dielectric layer 110, and second conductive interconnects, such as interconnects 120 of a first electrode 114 and a second electrode 116 of second interconnect layer 106, formed within a second portion of second layer 404.

The method may continue in accordance with an exemplary embodiment of the present invention with the deposition of a third layer 408 of dielectric material 122. Once deposited, a first patterned photoresist (not shown) is formed on the dielectric material 122 and is used as an etch mask during etching of dielectric material 122. Dielectric material 122 is etched to expose second conductive interconnects 120 and form openings 412 within which one or more via bars 128 can be formed. The first patterned photoresist is removed and a second patterned photoresist (not shown) is formed on the dielectric material 122. The second patterned photoresist is used as an etch mask during etching of third layer 408 to form shallower openings 410 within which third conductive interconnects, such as conductive interconnects 120 of a first electrode 114 and a second electrode 116, can be formed.

A conductive material layer 414 is deposited overlying the second interconnect layer 106 and within openings 410 and 412. The conductive material layer 414 may comprise any suitable conductive material such as those used for conductive material layer 402. Preferably, the conductive material layer 414 comprises copper or aluminum. One or more barrier or seed layers comprising, for example, tantalum nitride or titanium nitride may be deposited before deposition of conductive material layer 414. Any excess conductive material overlying third layer 408 of dielectric material 122 may be removed, such as by CMP, to form a via 128 bar within a first portion of third layer 408 of dielectric material, shown in FIG. 1 as second dielectric layer 112, and third conductive interconnects, such as conductive interconnects of a first electrode 114 and a second electrode 116 of third interconnect layer 108. The method may continue with the deposition and etching of additional layers of dielectric material, each deposition and etching step followed by the deposition and planarization of additional conductive material layers to form additional via bars and interconnect layers of vertical plate capacitor 100. While FIGS. 8-11 demonstrate a method of forming a vertical plate capacitor 100 using a dual damascene method, it will be appreciated that a single damascene method also may be used to form the capacitor. For example, second layer 404 may be formed in two steps, that is, a first sub-layer of layer 404 is deposited and etched to form a via opening 412, which is subsequently filled with metal to form a via bar 128 and, after CMP, a second sub-layer of layer 404 is deposited and etched to form an interconnect opening 410, which is subsequently filled with metal to form interconnect 120. Further, while FIGS. 8-11 demonstrate a method for forming a density-conforming vertical plate capacitor 100, it will be appreciated that the method can be used to fabricate other configurations of density-conforming vertical plate capacitors having a first conductive interconnect and a second conductive interconnect electrically and physically coupled by a via bar, such as those configuration depicted in FIGS. 3, and 5-7.

Accordingly, density-conforming vertical plate capacitors with enhanced capacitance and methods for fabricating density-conforming vertical plate capacitors with enhanced capacitance have been provided. The density-conforming vertical plate capacitors comprise via bars that electrically and physically couple interconnects of the capacitors to parallel, overlying interconnects of the capacitors. The via bars have a width and a length that is greater than the width. The greater the lengths of the via bars, that is, the more closely the lengths of the via bars approach the lengths of the interconnects, the more closely the vertical plate capacitors resemble capacitors with optimal vertical plates that result in maximum capacitance. The via bars are able to increase the capacitance of the vertical plate capacitor without requiring an increase in the length, width, or height of the interconnects of the capacitor, which could result in metal density variations. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A density-conforming vertical plate capacitor comprising:
   a first conductive interconnect;
   a second conductive interconnect, wherein the second conductive interconnect overlies the first conductive interconnect and is substantially aligned with the first conductive interconnect; and
   a first via bar electrically coupling the first conductive interconnect and the second conductive interconnect, wherein the first via bar has a width and a length that is larger than the width, and wherein the first via bar contributes to the capacitance of the vertical plate capacitor.

2. The density-conforming vertical plate capacitor of claim 1, wherein the length of the first via bar is at least about twice the width.

3. The density-conforming vertical plate capacitor of claim 2, wherein the length of the first via bar is at least about three times the width.

4. The density-conforming vertical plate capacitor of claim 1, wherein the first conductive interconnect has a length and the second conductive interconnect has a length and the length of the first via bar is substantially equal to the length of the first conductive interconnect, the length of the second conductive interconnect, or the lengths of both the first conductive interconnect and the second conductive interconnect.

5. The density-conforming vertical plate capacitor of claim 1, wherein the first via bar is disposed within a dielectric layer and further comprising a second via bar disposed within the dielectric layer, wherein the first via bar is parallel to the second via bar.

6. The density-conforming vertical plate capacitor of claim 5, wherein at least a portion of a surface of the first via bar directly faces at least a portion of a surface of the second via bar.

7. The density-conforming vertical plate capacitor of claim 5, wherein the second via bar electrically and physically couples a third conductive interconnect and a fourth conductive interconnect, wherein the first conductive interconnect and the third conductive interconnect are coupled to a stub of a first electrode, and wherein conductive interconnects of a second electrode are interdigitated with the first conductive interconnect and the third conductive interconnect.

8. The density-conforming vertical plate capacitor of claim 5, wherein the second via bar electrically and physically couples a third conductive interconnect and a fourth conductive interconnect, wherein the first conductive interconnect and the second conductive interconnect are electrically coupled to a stub of a first electrode to form a first interconnect projection extending from the stub of the first electrode, wherein the third conductive interconnect and the fourth conductive interconnect are electrically coupled to a stub of a second electrode to form a second interconnect projection extending from the stub of the second electrode, and wherein the first interconnect projection and the third interconnect projection are interdigitated.

9. The density-conforming vertical plate capacitor of claim 1, further comprising a second via bar electrically coupled between the first conductive interconnect and the second conductive interconnect, the second via bar having a width and a length that is larger than its width.

10. The density-conforming vertical plate capacitor of claim 1, wherein the first via bar is perpendicular to the first conductive interconnect.

* * * * *